United States Patent [19]

Camp, Jr.

[11] 3,803,514

[45] Apr. 9, 1974

[54] MICROWAVE OSCILLATOR

[75] Inventor: William O. Camp, Jr., Dryden, N.Y.

[73] Assignee: Cayuga Associates, Inc., Ithaca, N.Y.

[22] Filed: June 5, 1972

[21] Appl. No.: 259,702

[52] U.S. Cl. ........... 331/107 G, 331/107 R, 331/96, 331/101

[51] Int. Cl. ........................................... H03b 3/02

[58] Field of Search ........... 331/107 R, 107 G, 101, 331/96

[56] References Cited

UNITED STATES PATENTS

| | | | |
|---|---|---|---|
| 3,416,098 | 12/1968 | Vane | 331/107 G |
| 3,628,183 | 12/1971 | Strenglein | 331/96 |

OTHER PUBLICATIONS

IEEE Trans. on Elect. Devices, Aug. 1968, J. Gaffney, pp. 615–617.

IEEE Trans. On Micro. Theory, Vol. MTT–18, No. 11, Nov. 1970, pp. 827–829, Reynolds et al.

*Primary Examiner*—Herman Karl Saalbach

*Assistant Examiner*—Richard A. Rosenberger

*Attorney, Agent, or Firm*—N. Jerome Rudy

[57] ABSTRACT

A resonant circuit for an LSA mode semiconductor is formed by a radial transmission line cavity in which a dielectric substrate is disposed in a circular cavity formed in a disc-shaped metal block. The semiconductor is positioned in the center of the cavity, and oscillatory energy is coupled to an external load by a slightly off-center coaxial transmission line extending through the substrate and block. Bias voltage is applied between the block and a metallization layer on the substrate. In another circuit, the semiconductor is centrally mounted on an insulated metal slug filling one end of a cylindrical housing. The center wire of a coaxial output transmission line in the other end of the housing contacts the semiconductor. An adjustable conductive element in sliding electrical contact with the center wire and housing tunes the cavity by changing the total inductance and simultaneously changes the amount of output coupling.

6 Claims, 10 Drawing Figures

MICROWAVE OSCILLATOR

BACKGROUND OF THE INVENTION

It is known that electrical oscillations in the microwave region can be induced in certain types of semiconductor devices. For example, those diodes capable of producing the so-called and known Gunn effect--following the teachings of Dr. John B. Gunn as exemplified in U.S. Pat. No. 3,365,583 and/or the so-called Limited Space Charge Accumulation (i.e., "LSA") diodes—as explained, for example, by Dr. J. A. Copeland III in Proc. IEEE (Letters), Vol. 54, pg. 1479, 1966 and also, inter alia, in U.S. Pat. No. 3,508,169–are capable under specific biasing conditions in appropriate microwave resonant cavities, of such induction.

The present invention relates, in general, to the field of oscillator circuits having microwave resonant cavities. More particularly, it pertains to resonant cavities for semiconductor oscillators which exhibit bulk negative resistivity at bias voltages in excess of the threshold of Gunn effect oscillations and operate in the LSA (limited space charge accumulation) mode (as are hereinafter more fully explained). Yet more specifically, the invention concerns the design of radial transmission line cavities for sustaining LSA oscillations and coupling oscillatory energy to an external load via a coaxial transmission line.

LSA mode diode oscillators are currently under serious use plus further consideration and investigation as a new and relatively inexpensive miniature source of high power microwave signals; especially insofar as concerns those that are exceptionally useful in the fields of communications and radar. Following Gunn's discovery of transit time current oscillations in thin multi-layer wafers of N-type gallium arsenide crystals, it was found (as above indicated) by Copeland that truly bulk (LSA) oscillations could be induced in gallium arsenide (i.e., "GaAs") crystals under certain conditions. The LSA mode of operation of microwave diodes is particularly susceptible to being characterized by the fact that an intermittent electric field is applied between opposite faces of the diode material. The field is established by direct current (i.e., "DC") bias voltage pulses having a predetermined duty cycle and amplitude; and the microwave radio frequency (i.e., "RF") output of the LSA diode is in pulse form, rather than continuous wave as in Gunn effect devices.

For most successful operation, it has been found that an LSA diode requires a microwave circuit with high unloaded "Q"; plus a microwave reflection having high voltage standing wave ratio (i.e., "VSWR"); and a location approximately between about 0.05 and 0.1 wave length from the device; as well as having a minimum of conflicting reflections and the ability to couple microwave energy to a useful load. In this connection and for further explanatory background, reference may be had to the paper of Dr. William O. Camp, Jr., which appears at pgs. 1175–1184 of "IEEE Transactions On Electronic Devices", Vol. ED–18, No. 12, for Dec, 1971.

SUMMARY OF THE INVENTION

The general object of the invention is to sustain LSA microwave oscillations and couple the oscillatory energy to an external load by providing a radial transmission line cavity which satisfies the requirements for an LSA microwave resonant circuit. Another object of this invention is to provide means for varying the total circuit inductance to change the resonant frequency of the cavity. A still further object of the invention is to provide means for adjusting the total inductance of the circuit and simultaneously altering the amount of output coupling.

In one form of microwave resonant circuit in pursuance with the present invention and in accordance herewith, a dielectric substrate is disposed in a circular cavity formed in a disc-shaped metal block with the LSA semiconductor positioned in the center of the cavity and the coaxial output line slightly off axis. The substrate has a central aperture. In this, the semiconductor is mounted on a post contacting the metal block at the bottom of the cavity. The exposed side of the substrate is metallized and protrudes from the block to an extent that, advantageously, is less than about 1/20th of the thickness of the substrate. An off-axis aperture parallel to the central aperture is formed through the substrate and the metal block. A central conductor extending coaxially through the off-axis aperture contacts the substrate metallization to complete the coaxial output transmission line. A metal ring is mounted on top of the block coaxially with respect to the axis of the cavity and overlaps the metallized substrate and the adjacent annular surface of the block. The block is insulated from the ring by a thin dielectric layer. The exposed face of the semiconductor, opposite the face contacted by the post, is connected by a thin conductor to the metallization of the substrate. Bias voltage pulses are applied between the ring and the metal block which are electrically connected to the opposite faces of the semiconductor.

In another desirable and advantageous embodiment of the present invention, the exposed surface of the substrate and adjacent annular surface of the block are covered with a dielectric layer. A metallization layer covers the entire dielectric layer. The resulting assembly has electrical properties similar to those of the aforementioned microwave circuit, but has the advantage of being ordinarily easier to fabricate.

In another LSA microwave circuit, a cylindrical housing contains an insulated cylindrical block or slug co-axially mounted in the housing adjacent one end thereof. An LSA semiconductor is positioned centrally in the housing on the surface of the slug facing the other end of the housing. The one end of the housing has an opening through which the metal slug can be electrically contacted. The other end of the housing has an adjustable fitting with a coaxial transmission line having a central conductor coaxial with the cylindrical axis of the housing. The central conductor contacts one face of the semiconductor and the slug contacts the opposite face. The central conductor is slidably contacted along its length within the housing by one end of an L-shaped conductor. The other end of the L-shaped conductor is connected to the adjustable fitting. Bias voltage is applied to one face of the semiconductor through the metal slug and to the opposite face via the housing, adjustable fitting, L-shaped conductor and central conductor. The inductive loop formed by the central conductor and the L-shaped conductor performs output coupling; and also provides the necessary microwave conductance therefor. The adjustable fitting is designed to allow the point of contact between the central conductor and the one end of the L-shaped conductor to be varied. This adjustment changes the amount of output coupling and the total inductance of the microwave circuit resulting in a change in the resonant frequency.

DESCRIPTION OF THE PREFERRED EMBODIMENTS

Figure 1:
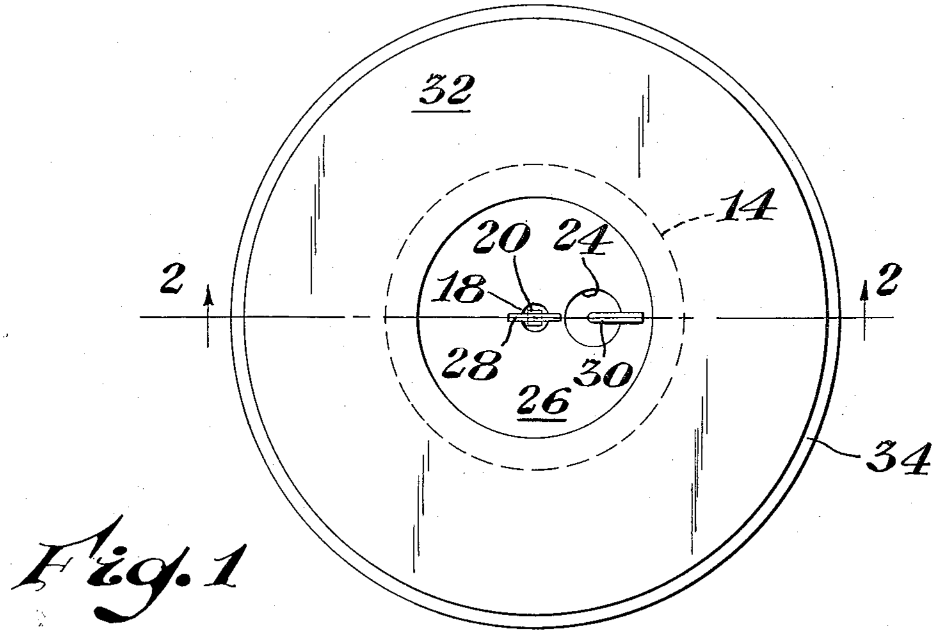
FIG. 1 is a plan view of a microwave resonant circuit according to the invention.
Figures 2, 3:
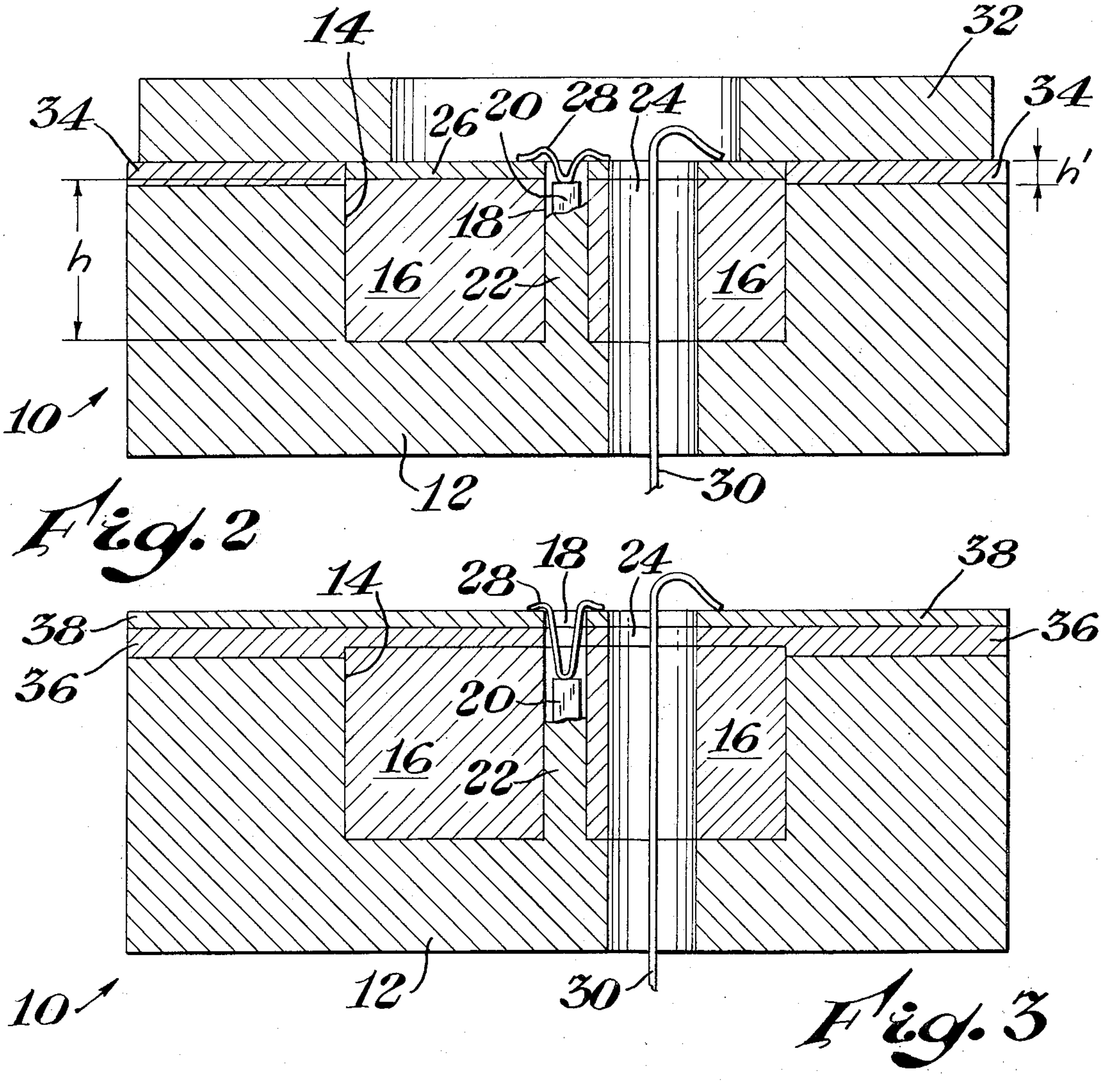
FIG. 2 is a sectional view taken along line 2—2 of FIG. 1.
FIG. 3 is a sectional view similar in presentation to that of FIG. 2, but illustrating an alternate embodiment of the circuits shown in FIGS. 1 and 2.

In FIGS. 1 and 2, a radial transmission line cavity forming a microwave resonant circuit for an LSA diode is illustrated generally by reference numeral 10. A circular, electrically conductive metal block 12 has a concentric recess or cavity 14. The cavity 14 is filled with a dielectric substrate 16 supplying inductance and having a central aperture 18 coaxial with the axis of the block 12. A bulk effect diode 20 is, ordinarily and advantageously, a GaAs semiconductor. The diode 20, regardless of specific nature, is located in the aperture 18 with one face thereof secured to the top of an electrically conductive metal post 22 which is disposed in the aperture 18 and contacts the block 12 at the floor of the cavity 14.

An off-axis aperture 24, closely spaced from aperture 18, extends parallel to the axis of the block 12 through the substrate 16 and the block 12. A conductive metallization layer 26 covers the upper exposed surface of the substrate 16 (with the exception of the apertures 18 and 24). The metallized substrate surface, pursuant to the teaching in the foregoing, protrudes from the block less than 1/20th of the thickness of the substrate. The exposed face of the semiconductor 20, opposite the face contacting the post 22, is connected to the metallization layer 26 by means of a thin conductor 28. A conductive center wire 30 extends coaxially through the aperture 24 and is connected at one end to the metallization layer 26.

The aperture 24 and the center wire 30 together form a coaxial transmission line for coupling the oscillatory energy to an external load (not shown). An electrically conductive metal ring 32 is mounted coaxially on top of the block 12 overlapping the metallization layer 26 and the metallization layer 26 and the adjacent annular surface of the block 12. The block 12 is insulated from the ring 32 by a thin dielectric layer 34 which covers the annular surface of the block 12. One face of the semiconductor 20 is electrically connected through the post 22 with the block 12, while the opposite face of the semiconductor 20 is connected to the metal ring 32 through the conductor 28 and the metallization layer 26. Thus, DC voltage pulses can be applied between the ring 32 and the block 12 to bias the semiconductor 20 into LSA mode oscillation.

In FIG. 3, a variation on the circuit of FIGS. 1 and 2 is shown. This variation can frequently greatly facilitate manufacture and assembly. As is depicted in FIG. 3, an insulation layer 36 covers the entire upper surface of the substrate 12 and adjacent annular surface of the block 12, with the exception of the apertures 18 and 24. A conductive metallization layer 38 is applied directly over the insulation layer 36. The conductors 28 and 30 are connected directly to the metallization layer 38. The DC bias voltage is applied between the metallization layer 38 and the block 12 connected respectively to opposite faces of the semiconductor 20. In FIG. 3, the post 22 is shown as an integral portion of the block 12. The circuits represented by the embodiment of FIGS. 1 and 2 and the alternative embodiment of FIG. 3 are, insofar as electircal characteristics are concerned and involved, similar.

In microwave resonant cavities, the resonant frequency is determined in part by the total inductance of the circuit. In the embodiments shown in FIGS. 1, 2 and 3, the total inductance of the circuit is directly proportional to the height of the substrate in the axial direction. The total inductance is also directly proportional to the natural logarithm of the ratio of the outer diameter of the substrate 16 to the diameter of the post 22 on which the semiconductor 20 is mounted. The change in the height of the radial transmission line, from $h$ to $h'$ (see FIG. 2), which occurs at the edge of the substrate 16 adjacent to the circular wall of the block 12 serves as a high VSWR reflection mechanism and similarly as the wavetrap is necessary to prevent leakage of oscillatory energy out of the cavity. For the circuits fo FIGS. 1 through 3, the resonance of the circuit determines the maximum frequency which the oscillator frequency approaches assymptotically at the highest possible bias voltage. The resonance is, in turn, determined by the total inductance of the circuit and the capacitance presented by the semiconductor 20 and the mounting post 22.

The degree of output coupling is determined by the amount of mutual inductance between the semiconductor 20 and the center wire 30 of the coaxial transmission line. The closer the center wire 20 is to the semiconductor, the heavier the coupling to the external load. The semiconductor 20 typically has a diameter of about 0.125 or so inches. The smallest convenient coaxial transmission line also and correspondingly has a diameter of about 0.125 or so inches. Therefore, the closest spacing of the center lines of the coaxial transmission line and the semiconductor 20 is approximately 0.125 inches. Using such FIGURES as a basis, the diameter of the cavity 14 is typically about 0.4 inches at 6.0 gHz operation; 0.3 inches at 8.0 gHz operation; and even smaller when higher frequencies are involved.

Figures 4, 5, 6:
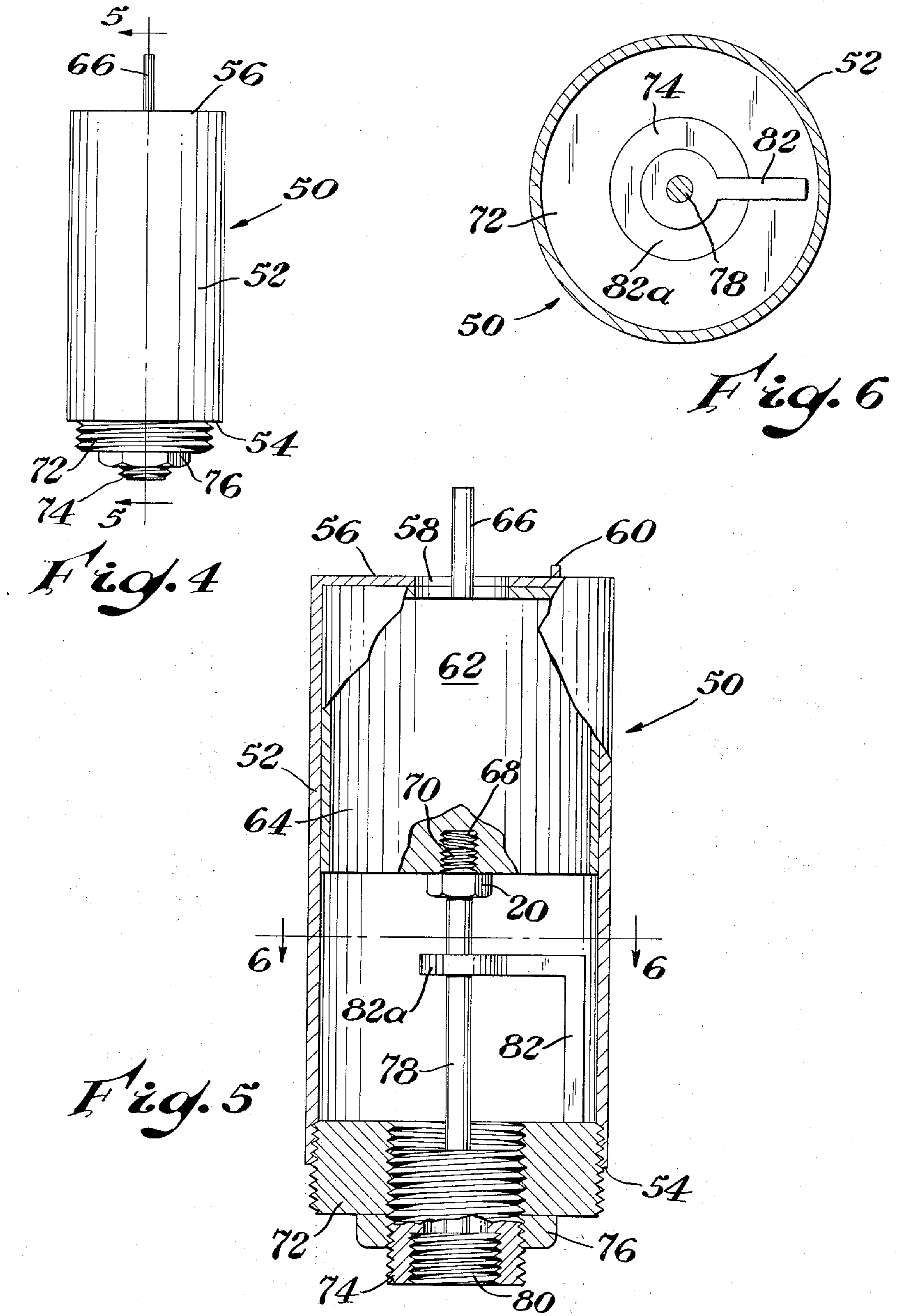
FIG. 4 is a side view of another microwave resonant circuit according to the present invention.
FIG. 5 is a sectional view taken along line 5—5 of FIG. 4.
FIG. 6 is a sectional view taken along line 6—6 of FIG. 5.

In FIGS. 4, 5 and 6, another microwave circuit, identified generally by the reference numeral 50, provides an adjustable radial oscillator cavity for varying the resonant frequency and the degree of coupling to an external load. An electrically conductive, elongated cylindrical metal housing 52 has an open end 54 with a threaded inner surface and an opposite end 56 closed with the exception of a central aperture 58. End 56 has a conductive terminal 60 formed thereon. A conductive cylindrical metal block or slug 62 having a diameter slightly less than the inner diameter of the housing 52 is coaxially mounted within the housing 52 adjacent to the end 56. The slug 62 is insulated from the metal housing 52 by a dielectric layer 64. A conductive bias voltage terminal 66 is connected coaxially to the slug 62 and extends out of the housing 52 through the aperture 58. The opposite end of the slug 62 facing the housing end 54 has a coaxial threaded bore 68. A bulk effect semiconductor 20, again usually an LSA GaAs diode, is fixed to a threaded peg 70 received in the bore 68 such that the semiconductor 20 is removably mounted on the inner surface of the slug 62 on the cylindrical axis of the housing 52.

An electrically conductive threaded annular fitting, identified by the number 72, is received in the threaded end 54 of the housing 52. An externally threaded coaxial connector 74 is received in a fitting 72 and protrudes therefrom away from the housing 52. The protruding end of the connector 74 receives a nut 76. The nut 76 can be tightened down on the fitting 72 and the connector 74 after adjustment. The inner end of the connector 74 supports and insulates a conductive center wire 78 coaxial with the housing 52. The wire 78 extends into the housing 52 and contacts the exposed face of the semiconductor opposite the face which is in contact with the slug 62. The center wire 78 extends coaxially through the connector 74 and terminates at a coaxial threaded bore 80 in the end of the connector 74 adapted to receive the mating end of a conventional coaxial cable connected to the external load (not shown).

A conductive L-shaped member 82 electrically connects the center wire 78 with the fitting 72 and provides the means for adjusting the parameters of the resonant cavity. One leg of the member 82 is parallel to the axis of the housing 52 and is spaced therefrom. The end of the parallel leg is rigidly connected to the annular fitting 72. The other leg of the member 82 extends radially inward perpendicularly to the axis of the housing 52 and terminates in a widened annular portion 82a having an aperture slidably receiving and electrically contacting the center wire 78.

DC bias voltage pulses are applied across the terminals 60 and 66 at the end 56 of the housing 52. The terminal 66 is electrically connected via the slug 62 to one face of the semiconductor 20. The terminal 60 is electrically connected to the opposite face of the semiconductor 20 through the housing 52, fitting 72, member 82 and center wire 78. The slug 62 forms a microwave short through which the bias voltage is applied.

When the nut 76 is loosened, the fitting 72 may be screwed further into or out of the housing 52. When the fitting 72 is turned, the member 82 rotates around the center wire 78 so that the point of contact between the member 82 and wire 78 thereby advances or retreats axially along the center wire 78. The center wire 78 and member 82 form an inductive loop to couple the oscillatory energy to the load. Rotating of the fitting 72 changes the plane of the loop as well as its axial distance from the semiconductor 20.

It can be shown that the total inductance of the microwave circuit of FIGS. 4, 5 and 6 is determined by the sum of the partial inductances $L_1$ and $L_2$; wherein $L_1$ is related to the axial distance between the semiconductor 20 and the member 82, and $L_2$ is related to the distance between the center wire 78 and the parallel leg of the member 82. When one increases the distance between the annular end 82*a* of the member 82 and the semiconductor 20, the inductance $L_1$ is correspondingly increased, thus changing the sum of $L_1$ to $L_2$. By changing the inductance $L_1$, the amount of coupling to the external load is changed as well as the resonant frequency of the cavity. As will be evident to those skilled in the art, the coupling is thus proportional to the ratio of the value $L_2$ to the value for the sum of $L_1$ plus $L_2$. For example, increasing the inductance $L_1$ lowers the resonant frequency of the cavity and accordingly decreases the coupling to the load.

The microwave circuit 50 is therefore tuneable as well as variable in the amount of output coupling. Because of the adjustability of the microwave circuit 50, semiconductors having different electrical properties can be used in the cavity. Thus, a single easily manufactured adjustable cavity can accommodate various semiconductors. This is an especially important feature since the specific electrical properties of LSA semiconductors are difficult to control precisely during manufacture.

Figure 7:
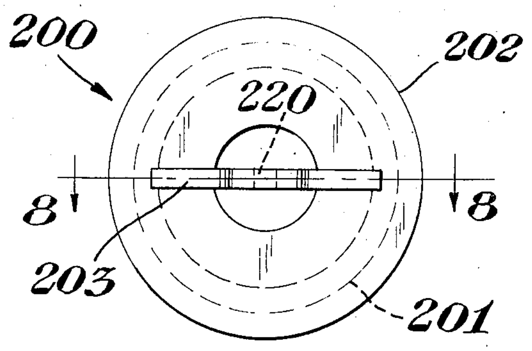
FIGS. 7 and 8, in respective schematic representation, illustrate in plan and side views how the diode in the assembly can, if desired, be readily contained in a threaded package for use in practice of the invention.
Figure 8:
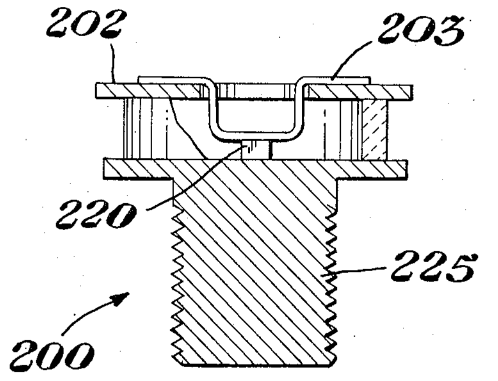

As mentioned in the foregoing Specification and with particular reference to FIGS. 7 and 8, the particular diode being utilized (identified in FIGS. 7 and 8 by reference numeral 220) can always, if so desired, be alternatively utilized and contained in a threaded package according to more conventional techniques for mounting of such devices. Thus, as shown in FIGS. 7 and 8, the package identified generally by reference numeral 200 contains the diode 220 mounted over and in the assembly or package 200 with the threaded portion 225 thereon (for convenient mechanical assembly) within the annular ceramic insulating portion 201 held down by metal ring 202 and electrically connected (and also positioned) under and by the gold—or equivalent—ribbon part 203. Use of a desired diode in such a package as illustrated in FIGS. 7 and 8 is, of course, obvious to any person skilled in the art.

Figure 9:
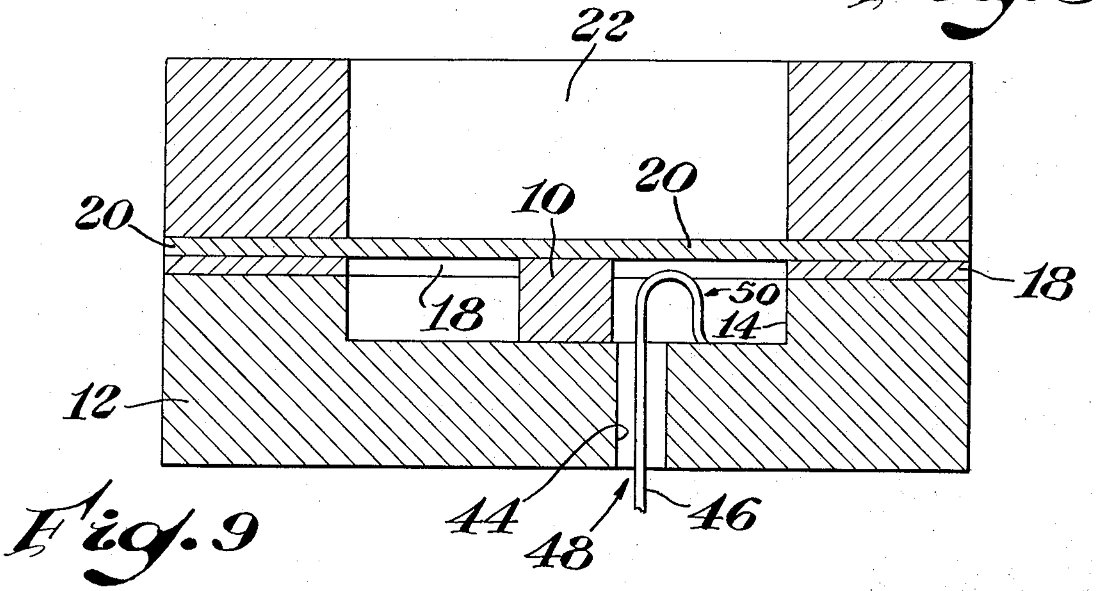
FIG. 9 is a sectional view which schematically illustrates one means of extracting energy from a cavity in accordance with the present invention, which is particularly good for purposes of maintaining isolation as to DC of the output line in order to avoid its affecting of or interference with, pursuant to transmission line theory, the DC input pulse shape.
Figure 10:
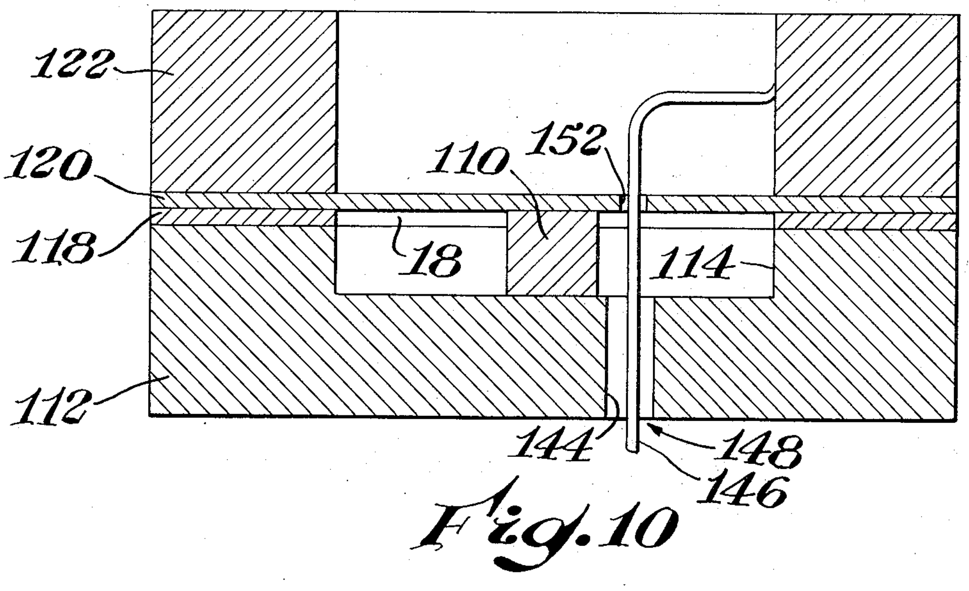
FIG. 10 is a sectional view similar to that of FIG. 9 illustrating another means of extracting energy from the cavity having the same advantages as above specified for the embodiment shown in FIG. 9.

In FIGS. 9 and 10, there are shown varied and modified embodiments which illustrate advantageous means for coupling the oscillatory energy of an embodiment according to the present invention to an external load.

In this connection, reference should be had and is hereby made to the copending Application for U.S. Letters Patent the applicant hereof with another, filed simultaneously on June 5, 1972 and copending herewith, having Ser. No. 263,352, entitled "MICROWAVE RESONANT CAVITY FOR SEMICONDUCTOR OSCILLATORS".

In the embodiment depicted in FIG. 9, a cylindrical aperture 44 which is parallel to the cavity axis is formed through the block 12 adjacent to the diode 10. A central conductor 46 extending through the aperture 44 forms therewith a coaxial transmission line 48. One end of the conductor 46 is connected to an external load (not shown). The other end terminates inside the resonant cavity and is connected to the floor of the recess 14 so as to form a planar inductive loop 50 for coupling the energy to the load.

In the embodiment illustrated in FIG. 10, a second aperture 152 aligned with the aperture 144 is formed through a foil element 120 above the recess 114. The central conductor 146 extends through both cavities 144 and 148 and terminates in contact with the conductive ring 122.

Successful output coupling in the embodiments of FIGS. 9 and 10 is achieved, even though the inherent symmetry of the cavity is broken by the off-axis placement of the coaxial output transmission line. The closer the conductor 146 of the output transmission line 148 is to the center of the diode 110, the stronger is the output coupling. The smallest (consistent) with the above indications) convenient size for the coaxial output transmission line 148 is typically about 0.125 inch or so in diameter. The smallest convenient size for the semiconductor 10 is typically and also, about 0.125 inch or so; and, therefore, (as has been explained), the minimum spacing between the center lines of the diode 110 and the coaxial transmission line 148 is approximately the indicated dimension of about 0.125 inch or so.

In FIGS. 9 and 10, the apertures also provide fluid communication between the interior of the recess 114 and the outside atmosphere. It is advantageous to equalize the air pressure in this or some other manner when a foil element is employed to reduce the risk of rupturing or deforming the foil in the presence of extremely high or low atmospheric pressure.

In the circuits shown in FIG. 1 through 3, an impedance transformer can (if desired) be included in the output coaxial transmission line. The entire circuitry illustrated by FIGS. 1 through 3 may be encased in plastic (or the like) to make it more rigid, also if advantageous for the purpose and so desired. The connection of the center wire 30 to the metallization layer 26 in FIG. 2 or 38 in FIG. 3, can be insulated by a thin dielectric in order to form a capacitor whose reactance is small compared to the load. It should be recognized that any shape of the substrate 16 may be used in the circular cavity 14 since the substrate 16 will still supply inductance so that the semiconductor 20 can oscillate. However, maximum efficiency is attained with the radial configuration wherein the substrate 16 completely fills the cavity 14, because maximum bias voltage can be applied to the circuit in this configuration. It is also recognized that multiple reflections may cause the wave forms to remain in a state that causes the device to fail unless the bias voltage is reduced.

In the circuit of FIGS. 4–6, other means of adjusting the inductance $L_1$ can be used besides the threaded fittings in the end 54 of the housing 52. It is only necessary that the member 82 be axially movable with respect to the center wire 78. For example, such movement could be provided by sliding fittings instead of threaded fittings, if desired. Furthermore, the precise configuration of the member 82 is not critical. It is only necessary that the member 82 be connected at one end to an axially moving adjusting member which is in electrical contact with the housing 52, that the other end of the member 82 be in sliding electrical contact with the center wire 78 and that the member 82 and center wire 78 cooperate to form an inductive loop.

It will be understood that various changes in the details, materials, steps and arrangements of parts which have been herein described and illustrated in order to explain the nature of the invention, may be made by those skilled in the art within the principle and scope of the invention as set forth and expressed in the hereto appended claims.

What is claimed is:

1. A microwave resonant circuit, comprising:

a disc-shaped block of conductive material having a coaxial cylindrical recess formed therein;

dielectric means operatively disposed in said recess for supplying inductance;

a coaxial conductive projection formed on the floor of said recess;

a bulk effect semiconductor element mounted on said projection;

conductive means disposed over said recess and overlapping the adjacent annular surface of said block but insulated therefrom;

means for electrically connecting said semiconductor element to said conductive means for supplying bias voltage to said element;

and a coaxial transmission line for coupling oscillatory energy to an external load having a cylindrical aperture parallel to the axis of said block and adjacent to said semiconductor element defined through said conductive means and said dielectric means and said block which has a central conductor coaxial with said aperture and extending therethrough having one end in electrical contact with said conductive means.

2. The resonant circuit of claim 1, wherein said dielectric means protrudes out of said recess by less than about 1/20th of the thickness of said dielectric means.

3. The resonant circuit of claim 2, wherein:

said conductive means includes a conductive layer disposed over said dielectric means and a conductive ring disposed coaxially with said recess over said adjacent annular surface of said block and overlapping said conductive layer;

with an annular insulating layer being inserted between said ring and said block.

4. The resonant circuit of claim 2 and further comprising in addition thereto and in combination therewith:

an insulating layer disposed on top of said dielectric means and said block;

said conductive means including a conductive layer disposed on top of said insulating layer;

and means for operatively connecting said conductive layer to said semiconductor element.

5. The resonant circuit of claim 1, wherein the inductance of said circuit is directly proportional both to the height of said dielectric means in the axial direction and to the natural logarithm of the ratio of the diameter of said dielectric means to the diameter of said projection.

6. A microwave resonant circuit, comprising:

means for defining a radial cavity;

said cavity-defining means includes a block of conductive material having a recessed portion with a circular cross-section and dielectric means disposed in said recess for supplying inductance;

a semiconductor element mounted at the central axis of said cavity and exhibiting bulk negative resistivity at bias voltages in excess of the Gunn threshold;

biasing means including conductive means disposed over said recess and insulated from said block for forming a wavetrap through which said bias voltage is applied;

means for operatively connecting said conductive means to said semiconductor element;

means for supporting said element in said recess in electrical contact with said block;

said biasing means adapted to operatively apply bias voltage across said element to cause the production of microwave oscillatory energy in said cavity;

and transmission line means in said cavity adjacent to said element and parallel to said central axis for coupling said oscillatory energy to an external load;

said transmission line means including a cylindrical aperture parallel to said central axis and displaced therefrom defined through said dielectric means and said block;

and a central conductor coaxial with said aperture and cooperating therewith to form a coaxial transmission line;

said central conductor being electrically connected to said conductive means.

* * * * *